United States Patent
Motobe et al.

(10) Patent No.: US 8,062,750 B2
(45) Date of Patent: Nov. 22, 2011

(54) EPOXY RESIN COMPOSITION FOR PREPREG, PREPREG AND MULTILAYERED PRINTED WIRING BOARD

(75) Inventors: Hidetsugu Motobe, Fukuyamamachi (JP); Yoshihiko Nakamura, Sukagawa (JP); Takeshi Koizumi, Asaka-machi (JP); Ryuji Takahashi, Fukushima (JP)

(73) Assignee: Matsushita Electric Works, Ltd., Osaka (JP)

( * ) Notice: Subject to any disclaimer, the term of this patent is extended or adjusted under 35 U.S.C. 154(b) by 750 days.

(21) Appl. No.: 11/659,408

(22) PCT Filed: Nov. 30, 2004

(86) PCT No.: PCT/JP2004/017760
§ 371 (c)(1),
(2), (4) Date: Sep. 2, 2008

(87) PCT Pub. No.: WO2006/059363
PCT Pub. Date: Jun. 8, 2006

(65) Prior Publication Data
US 2009/0008127 A1    Jan. 8, 2009

(51) Int. Cl.
  *B32B 27/38* (2006.01)
  *B32B 27/04* (2006.01)
  *B32B 27/20* (2006.01)
  *C08L 63/00* (2006.01)
  *C08L 85/02* (2006.01)

(52) U.S. Cl. .................. 428/413; 523/435; 525/525

(58) Field of Classification Search .............. 428/413; 523/435, 436; 525/525; 528/106, 108
See application file for complete search history.

(56) References Cited

U.S. PATENT DOCUMENTS 6,645,630 B1  11/2003  Nakamura et al.
2003/0152776 A1 *  8/2003  Kiuchi et al. ............. 428/413

FOREIGN PATENT DOCUMENTS

| JP | 11124489 | | 5/1999 |
| JP | 2000256537 | | 9/2000 |
| JP | 2001278957 | A * | 10/2001 |
| JP | 2001348420 | | 12/2001 |
| JP | 2003277487 | | 10/2003 |

OTHER PUBLICATIONS

Machine translation of JP 2001278957 A, provided by the JPO website (no date).*

* cited by examiner

*Primary Examiner* — Michael J Feely
(74) *Attorney, Agent, or Firm* — Meyertons, Hood, Kivlin, Kowert & Goetzel, P.C.; Eric B. Meyertons

(57) ABSTRACT

An epoxy resin composition for a prepreg used in manufacturing a printed wiring board, particularly a multilayered printed wiring board, is provided. The composition features: (A) a multifunctional epoxy resin having on average 2.8 or more epoxy groups per molecule; (B) a reaction product of a phosphorous compound, a bifunctional epoxy resin, and an optional multifunctional epoxy resin, provided in an amount of 20% to 55% by mass, based on the total amount of epoxy resin, including (A) and (B); (C) a curing agent of dicyandiamide and/or a multifunctional phenolic compound; and (D) an inorganic filler blend containing an inorganic filler with a thermal decomposition temperature of 400° C. or above. The composition does not generate toxic substances when combusted and has excellent ignition resistance, solder heat resistance after moisture absorption, and high temperature rigidity.

14 Claims, No Drawings

EPOXY RESIN COMPOSITION FOR PREPREG, PREPREG AND MULTILAYERED PRINTED WIRING BOARD

TECHNICAL FIELD

The present invention relates to an epoxy resin composition for prepregs used in manufacturing a printed wiring board comprising a multilayered printed wiring board, prepregs using said epoxy resin composition for the prepreg and a multilayered printed wiring board using said prepreg, and particularly to a printed wiring board for plastic packages and a printed wiring board for cards.

PRIOR ART

Ignition resistant epoxy resins are used in various electric insulation materials because of excellence in self-extinguishing, mechanical, moisture resistant and electrical properties.

Conventional ignition resistant epoxy resins contain halogen compounds comprising based on mainly bromine compounds in order to provide ignition resistance so that molded parts have self-extinguishing properties. However, combustion of such molded parts on fire might generate hazardous compounds to human health such as dibenzodioxins, furans and others. Furthermore, bromine containing compounds decompose the bromine structure on heating to deteriorate heat resistance over a long period of time. It is therefore required to develop molded parts with excellent ignition resistance and heat resistance without addition of halogen compounds.

Use of a phosphorous atom (phosphorous compounds) to provide ignition resistance has been mainly studied to address this request. For example, additive type phosphorous fire retardants of phosphorous ester compounds such as triphenyl phosphate (TPP), tricresyl phosphate (TCP), cresyldiphenyl phosphate (CDP) and others is formulated in a proper volume with the epoxy resin composition to allow for assuring good ignition resistance. On the other hand, such additive type phosphorous fire retardants do not react with the epoxy resin, causing new problems such as a big drop in solder heat resistance or chemical resistance such as alkaline resistance after moisture absorption of molded parts obtained.

With respect to the above problem, as disclosed in Japan Patent H4-11662, Japan Patent H11-166035 and Japan Patent H11-124489, use of reactive phosphorous fire retardants reacting with the epoxy resins is proposed. However, use of such phosphorous compounds gives molded products obtained higher moisture absorptivity than those with the halogen compounds as well as higher hardness and brittleness so that their solder heat resistance after moisture absorption is decreased. When general purpose epoxy resins such as a bisphenol A type epoxy resin is used, a glass transition temperature (Tg) of molded parts obtained becomes lower to decrease heat resistance.

While lead has thus far been used as a solder material, such lead has been spilled in recent years from electric and/or electronic products discarded to natural environment to cause serious problems so that use of a so-called lead free solder not containing lead has been initiated as countermeasure. Use of a lead free solder is anticipated to increase from now on, but very good solder heat resistance is required because treating temperature with a lead free solder is higher by about 10 to 20° C. than that with the conventional lead containing solder.

In the light of the above problems, present inventors discovered in Japan Patent 3412585 a method to satisfy both ignition resistance and various heat properties such as high solder heat resistance and high glass transition temperature (Tg) by reacting a bifunctional epoxy resin with a phosphorous containing bifunctional phenol compound to assure ignition resistance without addition of halogen compounds. Furthermore, present inventors discovered in Japan Patent 2001-348420 that a phosphorous containing bifunctional phenol compound and a bifunctional epoxy resin are reacted with a given amount of a multifunctional epoxy resin to yield a product with higher glass transition temperature (Tg).

However, more weight and thickness reduction and miniaturization of electronic devices in recent years require a thinner material for a printed wiring board material used and higher rigidity because its role as a support becomes more important. Particularly, use of a lead free solder described above requires higher temperature than a conventional reflow temperature so that a material with good high temperature rigidity is requested to take measures to reduce warping of a base substrate. However, the above conventional method cannot satisfy both good high temperature rigidity and solder heat resistance, of which either one does not reach a level of good high temperature rigidity requested.

The above Japan Patent 3412585 and Japan Patent 2001-348420 disclose a method, in which most of a phosphorous containing bifunctional phenol compound is reacted in advance to prepare a preliminary reactive epoxy resin, which is then used to prepare an epoxy resin composition. This method can prevent molded parts from decreasing solder heat resistance and chemical resistance after moisture absorption, which is a problem in providing ignition resistance with conventional additive type phosphorous compounds. In Japan Patent 2001-348420, a multifunctional epoxy resin is used in part in the above reaction to allow formation of molded parts with a higher glass transition temperature (Tg). However, in Japan Patent 3412585, 62% by mass to 80% by mass of the preliminarily reacted epoxy resin in a total epoxy resin is formulated, whereas in Japan Patent 2001-348420, 65% by mass to 66% by mass of the preliminarily reacted epoxy resin in a total epoxy resin is formulated. A problem with decrease of solder heat resistance after moisture absorption occurs, unless 60% by mass or more of the preliminarily reacted epoxy resin in a total epoxy resin is used. This is due to a fact that use of the preliminarily reacted epoxy resin yields a cured product with high toughness, good flexibility and good stress relaxation on heating, but decreases its effect when less than 60% by mass of the preliminarily reacted epoxy resin is used A method to improve rigidity of a base substrate includes a method to fill the resin with a large volume of inorganic fillers. However, viscosity of the preliminarily reacted epoxy resin is high (melt viscosity at 150° C. being from about 80 to 800 cps) and a method in Japan Patent 3412585 makes difficult uniform dispersion of the filler in the resin when addition more than 100 parts by mass or more of the inorganic filler to 100 parts by mass of the resin solid content, resulting in poor flow of the resin to make molding difficult.

Use of only 100 parts by mass of the inorganic filler does not give the base substrate enough rigidity and more volume need to be used in order to improve rigidity of the base substrate. However, the above method does not allow addition of more inorganic filler because a proportion of the highly viscous preliminarily reacted epoxy resin is high to increase the viscosity of whole epoxy resin.

In order to increase a volume of the inorganic filler added, a proportion of the preliminarily reacted epoxy resin in a total epoxy resin is reduced and a volume of the multifunctional epoxy resin (melt viscosity at 150° C. being about 1 to 10 ps) is increased, thus lowering viscosity of a total epoxy resin, allowing a more volume of the inorganic filler added and increasing a volume of the multifunctional component, thereby achieving a higher glass transition temperature (Tg) easier. However, the above method still has a problem, of which solder heat resistance after moisture absorption is decreased when a proportion of the preliminarily reacted epoxy resin is less than 60% by mass of the total epoxy resin.

DISCLOSURE OF INVENTION

Means for Solving Problems

The present invention has been carried out to address the above respects and has an object to provide an epoxy resin composition for prepregs used in manufacturing a printed wiring board comprising a multilayered printed wiring board, wherein the bifunctional epoxy resin for formulation is selected from a biphenyl type epoxy resin represented by formula (1), a naphthalene type epoxy resin represented by formula (2), a special bifunctional epoxy resin represented by formula (3) or a dicyclopentadiene containing bifunctional epoxy resin represented by formula (4), 20 parts or more by mass but less than 180 parts by mass of an inorganic filler with thermal decomposition temperature (weight loss by 5%) at 400° C. or higher is formulated with 100 parts by mass of the resin solid content, 110 parts or more by mass but less than 200 parts by mass of a total amount of inorganic fillers is formulated with 100 parts by mass of the resin solid component and dicyandiamide and/or multifunctional phenol compounds is used as a curing agent.

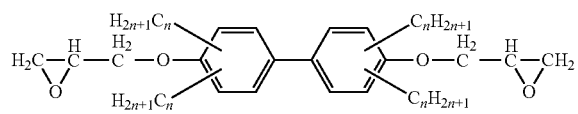 (1)

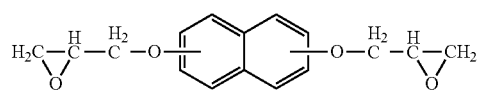 (2)

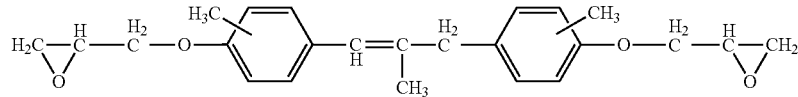 (3)

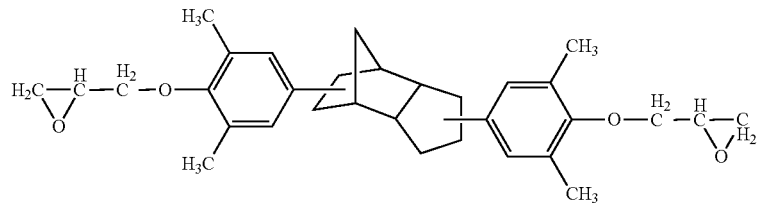 (4)

n = 0, 1, 2, 3, 4 which does not generate toxic substances on burning and is excellent in ignition resistance, solder heat resistance after moisture absorption and high temperature rigidity, prepregs using said epoxy resin composition for the prepreg and a multilayered printed wiring board using said prepreg.

Means for Solving Problems

An epoxy resin composition for a prepreg used in manufacturing a printed wiring board related to with claim 1 of the present invention comprises as an essential component from a phosphorous compound having on an average 1.8 or more but less than 3 phenolic hydoxyl groups reactive with an epoxy resin and 0.8 or more phosphorous atom on an average within a molecule, a bifunctional epoxy resin having on an average 1.8 or more but less than 2.6 epoxy groups within a molecule, a multifunctional epoxy resin having 2.8 or more epoxy groups on an average within a molecule, a curing agent and an inorganic filler with thermal decomposition temperature (weight loss by 5%) at 400° C. or higher, being characterized in that the phenolic hydroxyl group of the above phosphorous compound is reacted in advance with the above epoxy resin to yield a preliminarily reacted epoxy resin to adjust an epoxy equivalent of the above bifunctional epoxy resin to be 1.2 or higher but less than 3 against one equivalent of the phenolic hydroxyl group of the above phosphorous compound and add 20% by mass to 55% by mass of the above preliminarily reacted epoxy resin to a total epoxy resin, An epoxy resin composition for a prepreg used in manufacturing a printed wiring board related to claim 2 of the present invention is also characterized in that in claim 1, the preliminarily reacted epoxy resin is formulated and reacted in such ratio as 1.2 or more but less than 3 epoxy equivalents in the above bifunctional epoxy resin and 0.05 or more but less than 0.8 epoxy equivalent in the above multifunctional epoxy resin to one equivalent of the phenolic hydroxyl group of the above phosphorous compound.

An epoxy resin composition for a prepreg used in manufacturing a printed wiring board related to claim 3 of the present invention is also characterized in that in claim 1, aluminum hydroxide or magnesium hydroxide or both are used as the inorganic filler in addition to the inorganic filler with thermal decomposition temperature (weight loss by 5%) at 400° C. or higher.

An epoxy resin composition for a prepreg used in manufacturing a printed wiring board related to claim 4 of the present invention is also characterized in that in claim 1, spherical silica with an average particle diameter of from 0.05 µm to 5 µm is used as the inorganic filler with thermal decomposition temperature (weight loss by 5%) at 400° C. or higher.

An epoxy resin composition for a prepreg used in manufacturing a printed wiring board related to claim 5 of the present invention is also characterized in that in claim 1 the inorganic filler is surface-treated with a coupling agent.

An epoxy resin composition for a prepreg used in manufacturing a printed wiring board related to claim 6 of the present invention is also characterized in that in claim 1 a structure of the phosphorous compounds is represented by any one of formulas (5), (6) and (7).

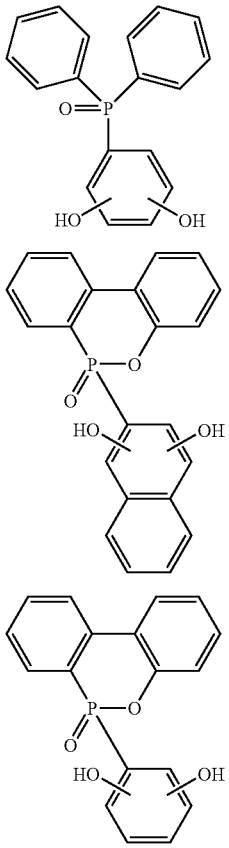

(5)

(6)

(7)

An epoxy resin composition for a prepreg used in manufacturing a printed wiring board related to claim 7 of the present invention is also characterized in that in claim 1, a content of the phosphorous atom component is 0.5% by mass or higher but less than 3.5% against a total amount of the epoxy resin.

An epoxy resin composition for a prepreg used in manufacturing a printed wiring board related to claim 8 of the present invention is also characterized in that in claim 1, a multifunctional epoxy resin of which benzene rings are linked by a bond other than methylene bond is used as a multifunctional epoxy resin.

An epoxy resin composition for a prepreg used in manufacturing a printed wiring board related to claim 9 of the present invention is also characterized in that in claim 1, a multifunctional phenol compound represented by formula (8) is used as a multifunctional phenol compound.

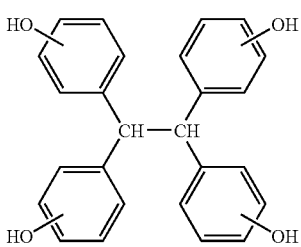

(8)

An epoxy resin composition for a prepreg used in manufacturing a printed wiring board related to with claim 10 of the present invention is also characterized in that in claim 1 a multifunctional phenol compound represented by formula (9) is used as a multifunctional phenol compound.

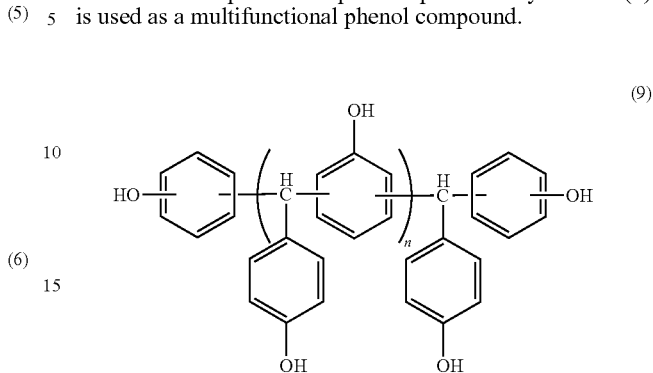

(9)

A prepreg related to claim 11 is also characterized in that a base substrate is impregnated with an epoxy resin composition for a prepreg described in any one of claims 1 to 10 and dried to semicure to yield a prepreg.

A multilayered printed wiring board related to claim 12 of the present invention is also characterized in that the prepregs described in claim 11 are laminated and molded on a base substrate for an inner layer, on which a circuit pattern is formed.

A prepreg related to claim 13 of the present invention is also characterized in that a base substrate is impregnated with a blackened epoxy resin composition, of which a black pigment and/or black dye is added to the epoxy resin composition for a prepreg described in any one of claims 1 to 10 and dried to semicure to yield a prepreg.

A multilayered printed wiring board related to claim 14 of the present invention is also characterized in that the prepregs described in claim 13 are laminated and molded on a base substrate for an inner layer, on which a circuit pattern is formed.

Effect of Invention

An epoxy resin composition for a prepreg used in manufacturing a printed wiring board related to claim 1 comprises as an essential component from a phosphorous compound having on an average 1.8 or more but less than 3 phenolic hydoxyl groups reactive with the epoxy resin and 0.8 or more phosphorous atom on an average within a molecule, a bifunctional epoxy resin having on an average 1.8 or more but less than 2.6 epoxy groups within a molecule, a multifunctional epoxy resin having o 2.8 or more epoxy groups on an average within a molecule, a curing agent and an inorganic filler with thermal decomposition temperature (weight loss by 5%) at 400° C. or higher, wherein the phenolic hydroxyl group of the above phosphorous compound is reacted in advance with the above epoxy resin at a such ratio as 1.2 or higher but less than 3 epoxy equivalents of the above bifunctional epoxy resin to one equivalent of the phenolic hydroxyl group of the above phosphorous compound to yield a preliminarily reacted epoxy resin, which is formulated with 20% to 55% by mass of a total epoxy resin, wherein the bifunctional epoxy resin formulated is selected from a biphenyl type epoxy resin represented by formula (1), a naphthalene type epoxy resin represented by formula (2), a special bifunctional epoxy resin represented by formula (3) or a dicyclopentadiene containing bifunctional epoxy resin represented by formula (4), 20 parts or more by mass but less than 180 parts by mass of an inorganic filler with thermal decomposition temperature (weight loss by 5%) at 400° C. or higher is formulated with 100 parts by mass of the resin solid content, 110 parts or more by mass but less than 200 parts by mass of a total amount of inorganic fillers is formulated with 100 parts by mass of the resin solid content and dicyandiamide and/or multifunctional phenol compound is used as a curing agent, so that ignition resistance can be improved without addition of halogen compounds with bromine atoms, which would generate toxic substances on combustion and selection of kinds and volume of the inorganic fillers added in a specific range allows production of a printed wiring board with high temperature excellent rigidity without decreasing solder heat temperature after moisture absorption.

An epoxy resin composition for a prepreg used in manufacturing a printed wiring board related to claim 2 allows satisfaction of both high temperature rigidity and solder heat resistance, since in the epoxy resin composition in claim 1, a preliminarily reacted epoxy resin is formulated and reacted in such ratio as 1.2 or more but less than 3 epoxy equivalents in the above bifunctional epoxy resin and 0.05 or more but less than 0.8 epoxy equivalent in the above multifunctional epoxy resin to one equivalent of the phenolic hydroxyl group of the above phosphorous compound.

An epoxy resin composition for a prepreg used in manufacturing a printed wiring board related to claim 3 also uses aluminum hydroxide or magnesium hydroxide or both as the inorganic filler in addition to the inorganic filler with thermal decomposition temperature (weight loss by 5%) at 400° C. or higher in the epoxy resin composition in claim 1 to contribute to ignition resistance.

An epoxy resin composition for a prepreg used in manufacturing a printed wiring board related to with claim 4 also uses spherical silica with average particle diameter of from 0.05 μm to 5 μm as the inorganic filler with thermal decomposition temperature (weight loss by 5%) at 400° C. or higher in the epoxy resin composition in claim 1, preventing viscosity of a varnish from increase and allowing addition of more fillers. Furthermore, moldability is little affected by filling.

An epoxy resin composition for a prepreg used in manufacturing a printed wiring board related to claim 5 also uses the inorganic filler surface-treated with a coupling agent in the epoxy resin composition in claim 1, preventing the filler from secondary aggregation to uniformly disperse and enhance adhesive force to the resin as well as allowing fillers with poor chemical resistance to improve it.

An epoxy resin composition for a prepreg used in manufacturing a printed wiring board related to with claim 6 also uses phosphorous compounds represented by any one of formulas (5), (6) and (7) as a structure of the phosphorous compound, so that ignition resistance can be improved without addition of halogen compounds such as bromine compounds as well as the phosphorous compounds can reliably react with the epoxy resin to yield a high polymer to prevent decrease of chemical resistance.

An epoxy resin composition for a prepreg used in manufacturing a printed wiring board related to with claim 7 also has a content of the phosphorous atom component is 0.5% by mass or higher but less than 3.5% against a total amount of the epoxy resin in the epoxy resin composition in claim 1, thereby improving fire ignition resistance without addition of halogen compounds as well as heat resistance while limiting moisture absorptivity.

An epoxy resin composition for a prepreg used in manufacturing a printed wiring board related to claim 8 also uses a multifunctional epoxy resin, of which benzene rings are linked by a bond other than methylene bond in the epoxy resin composition in claim 1, so that viscosity of the epoxy resin composition is low enough to allow smooth operation in impregnating a base substrate. A glass transition temperature (Tg) of molded parts obtained can be further markedly improved, because crosslinked density can be increased while limiting increase of the viscosity.

An epoxy resin composition for a prepreg used in manufacturing a printed wiring board related to with claim 9 also uses a multifunctional phenol compound represented by formula (8) as a multifunctional phenol compound in the epoxy resin composition in claim 1, allowing to yield molded parts with high heat resistance and high glass transition temperature (Tg) and further provide a UV shielding effect.

An epoxy resin composition for a prepreg used in manufacturing a printed wiring board related to claim 10 uses a multifunctional phenol compound represented by formula (9) as a multifunctional phenol compound in the epoxy resin composition in claim 1, allowing the formation of molded parts with high heat resistance and high glass transition temperature (Tg).

A prepreg associated with claim 11 also is prepared by impregnating a base substrate with an epoxy resin composition for the prepregs described in any one of claims 1 to 10 used to manufacture a printed wiring board and drying to semicure to yield a prepreg, which shows excellent ignition resistance without addition of halogen compounds such as bromine compounds and excellent thermal properties with high temperature rigidity without decreasing solder heat resistance after moisture absorption.

A multilayered printed wiring board related to claim 12 is also formed, of which the prepregs described in claim 11 are laminated and molded on a base substrate for an inner layer, on which a circuit pattern is formed, showing excellent ignition resistance without addition of halogen compounds such as bromine compounds and excellent thermal properties with high temperature rigidity without decreasing solder heat resistance after moisture absorption.

An epoxy resin composition for a prepreg related to claim 13 is also prepared, of which a base substrate is impregnated with a blackened epoxy resin composition, of which a black pigment and/or black dye is added to the epoxy resin composition described in any one of claims 1 to 10 and dried to semicure to yield a prepreg, which shows excellent ignition resistance without addition of halogen compounds such as bromine compounds and excellent thermal properties with high temperature rigidity without decreasing solder heat resistance after moisture absorption.

A multilayered printed wiring board related to claim 14 is also formed, of which the prepregs described in claim 13 are laminated and molded on a base substrate for an inner layer, on which a circuit pattern is formed, showing excellent ignition resistance without addition of halogen compounds such as bromine compounds and excellent thermal properties with high temperature rigidity without decreasing solder heat resistance after moisture absorption. Accuracy of automated optical inspection (AOI) in inspecting an inner layer circuit is further improved and useful. UV shielding is also provided.

BEST MODES FOR CARRYING OUT INVENTION

Embodiment of the present invention is described in the following.

The phosphorous compounds of the present invention is not particularly limited so far as the compounds comprise on an average 1.8 or more but less than 3 phenolic hydroxyl groups reactive with the epoxy resins and 0.8 or more phosphorous atom on an average within a molecule. When the phenolic hydroxyl group within a molecule is less than 1.8 on an average, its reaction with the bifunctional epoxy resin cannot yield a linear high polymer as described below, whereas by contraries, when a number of the hydroxyl group is 3 or more on an average, reaction of the bifunctional epoxy resins or multifunctional epoxy resins described below causes gelation to make consistent formulation difficult. When a number of phosphorous atoms are less than 0.8 on an average within a molecule, sufficient ignition resistance cannot be retained. A substantial upper limit of a number of the phosphorous atom is 2.5 on an average.

A content of the phosphorous atom component is also preferably 0.5% by mass or more but less than 3.5% by mass of a total epoxy resin in the epoxy resin composition. Sufficient ignition resistance can be assured in the above range without addition of the halogen compounds to the epoxy resins. When a content of the phosphorous atom component is less than 0.5% by mass, sufficient ignition resistance might not be retained. By contraries, when its content is 3.5% by mass or higher, molded parts readily absorb water and its heat resistance might be reduced.

Particularly preferred phosphorous compounds include any one of the phosphorous compounds represented by above formulas (5), (6), and (7). Use of these compounds allows further improving ignition resistance and heat resistance of molded products better than use of phosphorous compounds having other bifunctional phenolic hydroxyl group. One or two kinds or more of these compounds may be used singly or as a mixture.

The epoxy resin comprises as an essential component the bifunctional epoxy resin with 1.8 or more but less than 2.6 epoxy groups on an average within a molecule and the multifunctional epoxy resin with 2.8 or more epoxy groups on average within a molecule. The bifunctional epoxy resin is not particularly limited so far as an average number of the epoxy group within a molecule is within the above range, but particularly preferably selected from any one of a biphenyl type epoxy resin represented by formula (1), a naphthalene type epoxy resin represented by formula (2); a special bifunctional epoxy resin represented by formula (3) or a dicylopentaidene containing bifunctional epoxy resin represented by formula (4). Use of these epoxy resins can increase a glass transition temperature (Tg) of molded parts as compared with use of the conventional epoxy resins such as bisphenol A type epoxy resins. Such molded parts further retain rigidity to improve strength on heating to high temperature. When a number of the epoxy group in the bifunctional epoxy resin is less than 1.8 on an average within a molecule, reaction with the above phosphorous compound cannot yield a linear high polymer, whereas by contraries, when such number is 2.6 or higher on an average, such reaction with the above phosphorous compound easily causes gelation to make consistent formulation of the epoxy resin composition difficult.

A molecular structure of the multifunctional epoxy resin composition is also not particularly limited so far as an average number of the epoxy group within a molecule is within the above range. Addition of the above multifunctional epoxy resin allows improvement of the glass transition temperature (Tg). When an average number of the epoxy group within a molecule in the multifunctional epoxy resin is also less than 2.8, a crosslinked density of molded parts is insufficient, resulting in no improvement of the glass transition temperature (Tg).

The above multifunctional epoxy resins are preferably a phenol novolac type epoxy resin or cresol novolac type epoxy resin, both of which comprise an average number of the epoxy group of 3 or more but less than 5 within a molecule and have a softening temperature at 90° C. or lower. Both compounds are low with reactivity and yield an epoxy resin composition with low viscosity when formulated, leading to smooth operation such as impregnation of a base substrate and others. Meanwhile, when the softening temperature exceeds 90° C., reaction with the above phosphorous compound or the above bifunctional epoxy resin readily causes gelation because of high molecular weight type resin, resulting in a risk of which a consistent formulation of the epoxy resin composition becomes difficult.

As above multifunctional epoxy resin, a dicyclopentadiene containing phenol novolac type epoxy resin is further preferred, which is low with reactivity similar to the above phenol novolac type epoxy resin and cresol novolac type epoxy resin, thereby retaining viscosity of the epoxy resin composition formulated thereof low and allowing smooth operation such as impregnation of the base substrate and others. Furthermore, a glass transition temperature (Tg) of molded parts obtained can be substantially increased, contactness can be improved and little moisture absorption can occur.

The multifunctional epoxy resin further preferably comprises a number of the epoxy group of 2.8 or more but less than 3.8 on an average within a molecule. Since this number is low as an average number of the epoxy group among the multifunctional epoxy resins, reaction with the above phosphorous compounds or the above bifunctional epoxy resins does not rapidly build-up but restrain a molecular weight at lower level, thereby retaining its viscosity low enough enabling consistent formulation of the epoxy resin composition.

A multifunctional epoxy resin, of which the benzene rings are linked by a bond other than a methylene bond is particularly preferred. Such epoxy resin is low with reactivity and yielding an epoxy resin composition with low viscosity when formulated thereof and allowing smooth operation in impregnation of the base substrate. Furthermore, a crosslinked density can be increased while keeping viscosity low, thereby substantially increasing the glass transition temperature (Tg) of molded parts obtained.

One kind or two or more kinds of the above multifunctional epoxy resins can be used singly or as a mixture.

The epoxy resin composition related to the present invention is prepared by reacting in advance the above phosphorous compound with the epoxy resin (both bifunctional epoxy resin and multifunctional epoxy resin or only bifunctional epoxy resin). Such preliminarily reacted epoxy resins are preferably obtained by reacting 80% by mass or more phosphorous compounds used to adjust the epoxy resin composition with all or parts of the epoxy resin used to adjust the epoxy resin composition. When the phosphorous compound is less than 80% by mass in formulating the preliminarily reacted epoxy resin, a large amount of phosphorous containing bifunctional phenol compounds remain unreacted, resulting in no improvement of the solder heat resistance and chemical resistance of moldered parts after moisture absorption and potentially adverse effect on a long term insulation reliability and others.

A content of the above preliminarily reacted epoxy resin in a total amount of the epoxy resin is from 20% by mass to 55% by mass. When the content of the preliminarily reacted epoxy resin is less than 20% by mass, ignition resistance is insufficient, whereas when the content exceeds 55% by mass, high viscosity of the preliminarily reacted epoxy resin prevents the inorganic filler from filling in enough volume to give molded parts little rigidity.

An epoxy equivalent of the bifunctional epoxy resin to one equivalent of the phenolic hydroxyl group of the phosphorous compound is herein set at 1.2 or more but less than 3 s.

Selecting such epoxy equivalents allows substantial formation of the linear high polymer described above, thereby yielding molded parts with excellent toughness, flexibility, adhesiveness and stress relaxation on heating. When the bifunctional epoxy resin formulated in the above preliminarily reacted epoxy resin has an epoxy equivalent less than 1.2, molded parts lack toughness and show no improvement with solder heat resistance and chemical resistance after moisture absorption. By contraries, when the epoxy equivalent exceeds 3.0, heat resistance and a glass transition temperature of molded parts become poor. When the epoxy equivalent of the multifunctional epoxy resin formulated is less than 0.05, the glass transition temperature of molded parts cannot be increased. By contraries, when the epoxy equivalent is equal to 0.8 or higher, preliminarily reacted epoxy resin cannot be consistently obtained. Formulating and reacting in such ratio as the epoxy equivalent of 1.2 or higher but less than 3 in the above bifunctional epoxy resin and the epoxy equivalent of 0.05 or higher but less than 0.8 in the multifunctional epoxy resin to one equivalent of the phenolic hydroxyl group in the phosphorous compound allow to satisfy both high glass transition temperature and good solder heat resistance.

In the present invention, 20 parts by mass or higher but less than 180 parts by mass of the inorganic fillers with thermal decomposition temperature (weight loss by 5%) at 400° C. or higher are added to 100 parts by mass of the resin solid content, while a total volume of inorganic fillers added is kept at 110 parts by mass or higher but less than 200 parts by mass against to 100 parts by mass of the resin solid content. Meanwhile, in the present invention, thermal decomposition temperature is measured according to the IPC method. Selecting the above range of the inorganic fillers formulated assures both high solder heat resistance after moisture absorption and good high temperature rigidity even if the preliminarily reacted epoxy resin is less than 60% by mass against a total amount of the epoxy resin. When less than 20 parts by mass of the inorganic filler with the thermal decomposition temperature (weight loss by 5%) at 400° C. or higher is added to 100 parts by mass of the resin solid content, solder heat resistance after moisture absorption shows little improving effect. When 20 parts by mass or more but less than 180 parts by mass of the inorganic fillers with thermal decomposition temperature (weight loss by 5%) at 400° C. or higher are added to 100 parts by mass of the resin sold content as well as 200 parts by mass or more of the inorganic filler and excellent thermal properties with high temperature rigidity without decreasing solder heat resistance after moisture absorption, adhesiveness of molded parts is likely to be decreased.

Either aluminum hydroxide or magnesium hydroxide or both are preferably used as an inorganic filler except the inorganic fillers with thermal decomposition temperature (weight loss by 5%) at 400° C. or higher. Addition of such inorganic fillers to the epoxy resin composition can contribute to acquiring ignition resistance.

Spherical silica with an average particle diameter from 0.05 μm to 5 μm is also preferably used as the inorganic filler with the thermal decomposition temperature (weight loss by 5%) at 400° C. or higher. Use of such inorganic filler allows addition of more volume without increasing viscosity of a varnish and shows little effect on moldability, leading to better results as compared with the case using inorganic fillers except the above ones. When an average particle diameter is less than 0.05 μm, viscosity of the epoxy resin composition is possibly increased. On the other hand, when an average particle diameter exceeds 5 μm, a filter usually used in a manufacturing process to eliminate foreign particles contaminated from external environment could be clogged.

Furthermore, the inorganic fillers added to the epoxy resin composition are preferably surface-treated with a silane coupling agent. Surface treatment of the inorganic fillers can reinforce adhesion force to the resin and further improve features of the inorganic fillers themselves. Chemical resistance of aluminum hydroxide or magnesium hydroxide itself is not sufficient as the inorganic filler, but can be improved by surface treatment. Particularly, use of an epoxysilane coupling agent and/or mecaptosilane coupling agent for such surface treatment improves properties such as chemical resistance and others as well as allows the inorganic fillers to uniformly disperse in the epoxy resin composition while preventing the inorganic filler from secondary aggregation. Specific examples of the epoxysilane coupling agents herein include γ-glycidoxypropyltrimethoxysilane and γ-glycidoxypropylmethyidimethoxysilane and specific examples of the mercaptosilane coupling agents include γ-mercaptotrimethoxysilane and γ-mercaptopropyltriethoxysilane.

Dicyandiamide and/or multi functional phenol compound is used as a curing agent. Such compounds provide good electrical properties as well as cure the linear high polymer, which is a reaction product of the above phosphorous compound having the bifunctional phenolic hydroxyl group with the bifunctional epoxy resin, allowing to provide molded parts with excellent toughness, flexibility, adhesiveness and stress relaxation on heating. The multifunctional phenol compounds are preferably the compounds represented by the above formulas (8) or (9). Use of such compounds allows production of molded parts with high heat resistance and high glass transition temperature (Tg). Use of the multifunctional phenol compound represented by the above formula (8) provides a preferable effect on UV shielding.

In the present invention, in addition to the above components, epoxy resins other than the above compounds, additives, curing promoters and various modifiers may be added to the epoxy resin composition if needed. For example, a base substrate such as glass cloth and others is impregnated with an blackened epoxy resin with a black pigment and/or black dye added and dried to semicure to form a prepreg, which is used to produce a useful printed wiring board because of high accuracy of AOI inspection in inspecting a inner layer circuit. Furthermore, such board is provided with UV shielding. The above black pigment is not particularly limited to, but includes carbon black and others. The black dye is also not particularly limited to, but includes bisazo dyes and azine dyes.

The curing promoter is also not particularly limited, but tertiary amines or imidazoles may be added.

A polyvinyl acetal resin or rubber component such as styrene-butadiene rubber (SBR), butadiene rubber (BR), butyl rubber or butadiene-acrylonitrile copolymerized rubber may also be formulated as a modifier.

The epoxy resin composition obtained according to the above is then dissolved in a solvent for dilution to yield a varnish if needed. A base substrate is impregnated with such varnish and dried in a drier, for example, at a range of 120 to 190° C. for a length of 3 to 15 minutes to produce a prepreg in a semicured state (B-stage). The base substrate used may include kraft paper, natural fiber cloth, organic synthetic fiber cloth and others in addition to glass fiber cloth such as glass cloth, glass paper, glass mat and others.

Desired numbers of sheets of the prepreg thus manufactured are stacked and heated and pressed under a condition, for example at 140 to 200° C. and 0.98 to 4.9 MPa to manufacture a laminated sheet. On this occasion, a metal foil is superimposed on one or both sides of the prepreg, of which desired numbers are laminated and both prepreg and metal foil are heated and pressed together to manufacture a metal foil clad laminated sheet. Copper foils, silver foils, aluminum foils, stainless foils and others can be used as such metal foil. After prepregs are placed on both sides of a base substrate for inner layer, on which a circuit pattern is preformed and a metal foil is then superimposed on one or both sides of the prepreg with desired numbers of laminated sheets, both prepregs and metal foils are heated and pressed together to manufacture a multilayered printed wiring board.

Example 1

Examples of the present invention are specifically described in the following.

Epoxy resins, curing agents, phosphorous compounds, inorganic fillers, solvents and blackening agents used are at first given in this order.

Eight kinds of epoxy resins below were used.

Epoxy Resin 1: Tetramethylbiphenyl Type Bifunctional Epoxy Resin
"YX4000H" from Japan Epoxy Resin Co., Ltd.
This compound corresponds to an epoxy resin with n=1 in formula (1).
(Number of epoxy group=2.0 on an average and epoxy equivalent=195)

Epoxy Resin 2: Biphenyl Type Bifunctional Epoxy Resin
"YL6121" from Japan Epoxy Resin Co., Ltd.
This compound corresponds to a mixture of the epoxy resins with n=0 and n=1 in formula (1).
(Number of epoxy group=2.0 on an average and epoxy equivalent=172)

Epoxy Resin 3: Naphthalene Type Bifunctional Epoxy Resin in Formula (2)
"EPICLON-HP4032" from Dainippon Ink & Chemicals Inc.
(Number of epoxy group=2.0 on average and epoxy equivalent=150)

Epoxy Resin 4: Dicyclopentadiene Containing Bifunctional Epoxy Resin in Formula (4)
"ZX-1257" from Tohto Kasei Co., Ltd.
(Number of epoxy group=2.0 on an average and epoxy equivalent=257)

Epoxy resin 5: Multifunctional Epoxy Resin, of which Benzene Rings are Linked with a Bond Other than a Methylene Bond.
"EPPN502H" from Nippon Kayaku Co., Ltd. (Melt viscosity at 150° C. is about 5 ps.)
(Average number of epoxy group=7.0 and epoxy equivalent=170)

Epoxy resin 6: Multifunctional Epoxy Resin of which Benzene Rings are Coupled with a Bond Other than a Methylene Bond.
"VG3101" from Mitsui Petrochemical Industries, Ltd.
(Epoxy equivalent=219)
(Melt Viscosity at 150° C. is about 4 ps.)

Epoxy Resin 7: Multifunctional Epoxy Resin, of which Benzene Rings are Linked with a Bond Other than a Methylene Bond.
"FSX-220" from Sumitomo Chemical Co., Ltd.
(Epoxy equivalent=220)
(Melt Viscosity at 150° C. is about 4 ps.)

Epoxy resin 8: Phenol Novolac Type Multifunctional Epoxy Resin
"EPICLON-N740" from Dainippon & Chemicals Inc.
(Epoxy equivalent=180)
(Melt Viscosity at 150° C. is about 3 ps.)

Four kinds of curing agents below were used.

Curing Agent 1: Dicyandiamide
Reagent grade (molecular weight=84 and theoretical active hydrogen equivalent=21)

Curing Agent 2: Multifunctional Phenol Resin
"MEH7600" from Meiwa Kasei Co., Ltd.
(Phenolic hydroxyl equivalent=100)
Constitutional formula corresponds to formula (8).

Curing Agent 3: Multifunctional Phenol Resin
"MEH7500H" from Meiwa Kasei Co., Ltd.
(Phenolic hydroxyl equivalent=100)
Constitutional formula corresponds to formula (9).

Curing Agent 4: Multifunctional Phenol Resin
"TD-2093Y" from Dainippon Ink & Chemicals Inc.
(Phenolic hydroxyl equivalent=105)
Phenol Novolac Type Phenol Three kinds of the phosphorous compounds below were also used.

Phosphorous Compound 1: Compound of Formula (7) Having Two Phenolic Hydroxyl Groups on an Average.
"HCA-HQ" from Sanko Co., Ltd.
(Content of phosphorous=about 9.6% by mass and hydroxyl equivalent=about 162)

Phosphorous Compound 2: Compound of Formula (6) Having Two Phenolic Hydroxyl Groups on an Average.
"HCA-NQ" from Sanko Co., Ltd.
(Content of phosphorous=about 8.2% by mass and hydroxyl equivalent=about 188)

Phosphorous Compound 3: Compound of Formula (5) Having Two Phenolic Hydroxyl Groups on an Average.
(Diphenylphosphinylhydroquinone)
"PPQ" from Hokko Chemical Industry Co., Ltd.
(Content of phosphorous=about 10.1% by mass and hydroxyl equivalent=about 155)

Ten kinds of inorganic fillers below were also used.

Inorganic Filler 1: Aluminum Hydroxide
"HIGILITE H42M" from Showa Denko K. K.
(Average particle diameter=about 1 μm and thermal decomposition temperature=265° C.)

Inorganic Filler 2: Aluminum Hydroxide
"C302A" from Sumitomo Chemical Co., Ltd.
(Average particle diameter=about 2 μm and thermal decomposition temperature=280° C.)

Inorganic Filler 3: Aluminum Hydroxide
"C305" from Sumitomo Chemical Co., Ltd.
(Average particle diameter=about 5 mm and thermal decomposition temperature=270° C.)

Inorganic Filler 4: Magnesium Hydroxide
"KISUMA 5" from Kyowa Chemical Industry Co., Ltd.
(Average particle diameter=about 1 μm and thermal decomposition temperature=360° C.)

Inorganic Filler 5: Spherical Silica
"Kyklos MSR-04" from Tatsumori Co., Ltd.
(Average particle diameter=about 4.1 μm and thermal decomposition temperature=500° C. or higher)

Inorganic Filler 6: Spherical Silica
"FB-1SDX" from Denki Kagaku Kogyo Co., Ltd.
(Average particle diameter=about 1.5 μm and thermal decomposition temperature=500° C. or higher)

Inorganic Filler 7: Spherical Silica
"SFP-30M" from Denki Kagaku Kogyo Co., Ltd.
(Average particle diameter=about 0.72 μm and thermal decomposition temperature=500° C. or higher)

Inorganic Filler 8: Spherical Silica
"FB-945X" from Denki Kagaku Kogyo Co., Ltd.
(Average particle diameter=about 11.6 mm and thermal decomposition temperature=500° C. or higher)

Inorganic Filler 9: Spherical Silica
"SO-C2" from ADMATECHS Co., Ltd.
(Average particle diameter=about 0.5 μm and thermal decomposition temperature=500° C. or higher)
Inorganic filler 10: Inorganic filler 3 (100 parts by mass), which is surface-treated in a dry method with a coupling agent (about 1.5 part by mass of epoxysilane coupling agent, "KBM403", glycidopropyltrimethoxysilane from Shi-Etsu Chemical Co., Ltd.).

A curing promoter below was also used.
Curing promoter 1: 2-Ethyl-4-methylimidazole from Shikoku Chemicals Corp.

Three kinds of solvents below were also used.
Solvent 1: Methyl ethyl ketone (MEK)
Solvent 2: Methoxypropanol (MP)
Solvent 3: Dimethylformamide (DMF)

A blackening agent below was also used.
Blackening agent 1: "Adalright DW-07" from Ciba Specialty Chemicals Inc.

Eight kinds of the preliminarily reacted epoxy resins shown below were prepared using the above epoxy resins, phosphorous compounds and others.

Preliminarily Reacted Epoxy Resin 1
Both epoxy resin 1 (70 parts by mass) and phosphorous compound 1 (30 parts by mass) were heated with stirring in a mixed solvent of solvent 2 (64.0 parts by mass) and solvent 3 (2.67 parts by mass) at 115° C. Triphenylphosphine (0.2 part by mass) was then added to the mixture, which was continuously heated with stirring for about 5 hours to yield a preliminarily reacted epoxy resin 1, of which a solid content was 60% by mass, the epoxy equivalent and phosphorous content in the solid component were about 500 and about 2.9% by mass, respectively, and melt viscosity of the solid component at 150° C. was about 110 ps.

Preliminarily Reacted Epoxy Resin 2
Epoxy resin 1 (60.9 parts by mass), epoxy resin 5 (9.3 parts by mass) and phosphorous compound 1 (29.8 parts by mass) were heated with stirring in solvent 2 (53.8 parts by mass) at 115° C. Triphenylphosphine (0.2 part by mass) was then added to the mixture, which was continuously heated with stirring for about 8 hours to yield a preliminarily reacted epoxy resin 2, of which a solid content was 65% by mass, the epoxy equivalent and phosphorous content in the solid component were about 540 and about 2.9% by mass, respectively, and melt viscosity of the solid component at 150° C. was about 200 ps.

Preliminarily Reacted Epoxy Resin 3
Both epoxy resin 2 (67 parts by mass) and phosphorous compound 1 (33 parts by mass) in the absence of the solvent were heated with stirring at 130° C. Triphenylphosphine (0.2 part by mass) was then added to the mixture, which was continued to heat with stirring for about 4 hours to yield a preliminarily reacted epoxy resin 3 with the epoxy equivalent of about 500 and melt viscosity at 150° C. of about 100 ps.

Preliminarily Reacted Epoxy Resin 4
Both epoxy resin 3 (70 parts by mass) and phosphorous compound 3 (30 parts by mass) in the absence of the solvent were heated with stirring at 130° C. Triphenylphosphine (0.2 part by mass) was then added to the mixture, which was continuously heated with stirring for about 4 hours to yield a preliminarily reacted epoxy resin 4 with the epoxy equivalent of about 300 and melt viscosity at 150° C. of about 100 ps.

Preliminarily Reacted Epoxy Resin 5
Both epoxy resin 4 (75 parts by mass) and phosphorous compound 1 (25 parts by mass) in the absence of the solvent were heated with stirring at 130° C. Triphenylphosphine (0.2 part by mass) was then added to the mixture, which was continuously heated with stirring for about 4 hours to yield a preliminarily reacted epoxy resin 5 with the epoxy equivalent of about 420 and melt viscosity at 150° C. of about 120 ps.

Preliminarily Reacted Epoxy Resin 6
Both epoxy resin 1 (70 parts by mass) and phosphorous compound 2 (30 parts by mass) in the absence of the solvent were heated with stirring at 130° C. Triphenylphosphine (0.2 part by mass) was then added to the mixture, which was continuously heated with stirring for about 4 hours to yield a preliminarily reacted epoxy resin 6 with the epoxy equivalent of about 540 and melt viscosity at 150° C. of about 500 ps Preliminarily Reacted Epoxy Resin 7
Both epoxy resin 1 (70 parts by mass) and phosphorous compound 1 (30 parts by mass) were heated with stirring in solvent 2 (53.8 parts by mass) at 115° C. Triphenylphosphine (0.2 part by mass) was then added to the mixture, which was continuously heated with stirring for about 10 hours to yield a preliminarily reacted epoxy resin 7, of which a solid content was 65% by mass, the epoxy equivalent and phosphorous content in the solid component were about 550 and about 2.9% by mass, respectively, and melt viscosity of the solid component at 150° C. was about 130 ps.

Preliminarily Reacted Epoxy Resin 8
Epoxy resin 1 (58.6 parts by mass), epoxy resin 5 (6.9 parts by mass) and phosphorous compound 1 (34.5 parts by mass) were heated with stirring in solvent 2 (53.8 parts by mass) at 115° C. Triphenylphosphine (0.2 part by mass) was then added to the mixture, which was continuously heated with stirring for about 8 hours to yield a preliminarily reacted epoxy resin 8, of which a solid content was 65% by mass, the epoxy equivalent and phosphorous content in the solid component were about 530 and about 3.3% by mass, respectively, and melt viscosity of the solid component at 150° C. was about 150 ps.

In preparation of the epoxy resin composition using the above materials, the preliminarily reacted epoxy resin, other epoxy resins, phosphorous compounds, inorganic fillers, curing agents, solvents and other additives were fed into a "Homomixer" blending equipment from PRIMIX Corp., in which the mixture was stirred at about 1000 rpm for about 120 minutes. After addition of a curing promoter, the mixture was stirred again for 30 minutes and then milled in a "Nanomill" milling machine from Asada Iron Works Co., Ltd to disperse the inorganic filler to yield a varnish.

According to the above method, the epoxy resin compositions for prepreg in Examples 1 to 12 and Comparative Examples 1 to 4 were obtained using a formulation shown in Tables 1 to 5. Prepregs, copper clad laminated sheets and multilayered laminated sheets were then prepared using the epoxy resin compositions obtained as detailed below. The preliminarily reacted resins in Tables 1 to 5 indicate the preliminarily reacted epoxy resins.

Method to Manufacture Prepreg
A glass cloth (WEA116E from Nittobo Co., Ltd., thickness=0.1 mm) was impregnated with the epoxy resin composition prepared as a varnish according to the above method and dried in a dryer in a range of 120° C. to 190° C. for a length of 5 to 10 minutes to yield a prepreg in a semicured state (B-stage). Meanwhile, in Example 5, 10 parts by mass of blackening agent 1 was added to the epoxy resin composition for prepreg to blacken.

Method to Manufacture Copper Clad Laminated Sheet
One, two or eight sheets of the prepreg manufactured according to the above method were stacked, on both sides of which a copper foil was superimposed to heat and press at 140 to 180° C. and 0.98 to 3.9 MPa to manufacture copper clad laminated sheets with thickness of about 0.1 mm, about 0.2 mm and about 0.8 mm, respectively. Heating time was set to last at least 90 minutes or longer to keep the whole prepreg at 160° C. or higher. On this occasion, an inside of a press was evacuated to a pressure at 133 hPa or lower. This condition allows effective removal of water absorbed by the prepreg and prevention of an airspace (void) remained in the prepreg after molding. Meanwhile, a "GT" foil from Furukawa Circuit Foil Co., Ltd. (thickness=0.018 mm) was used as a copper foil.
Method to Manufacture Multilayered Laminated Sheet A copper foil (thickness=18 μm with a pattern which was formed on a base substrate for an inner layer (copper clad laminated sheet prepared according to the above method, thickness=0.2 mm) was treated for an inner layer. A sheet of the prepreg was then placed on both sides of such base substrate for the inner layer and a sheet of the copper foil was further superimposed on both prepregs to mold to the multilayered laminated sheets using the molding condition similar to the above.

Physical properties given below were measured for the molded parts thus obtained using the above condition.
Ignition Resistance and Average Time in Seconds for Flame Quenching A copper foil on the surface of copper clad laminated sheet with thickness of 0.2 mm was etched to remove and cut into a specimen 125 mm long and 13 mm wide, which was used in a combustion behavior test according to "Test for Flammability of Plastic Materials—UL94" from Underwriters Lavatories. An average time from ignition to quenching was also measured to know the difference with flame quenching.
Glass Transition Temperature (Tg)

A copper foil on the surface of copper clad laminated sheet with thickness of 0.8 mm was etched to remove and cut into a specimen 30 mm long and 5 mm wide, which was used to measure tan δ with a viscoelasticity spectrometer, where the peak temperature was assigned to Tg.

Solder Heat Resistance in Boiling Water

A copper foil was similarly removed to the above from the multilayered laminated sheet comprising the base substrate for the inner layer and cut into a 50 mm square, of which 5 sheets prepared were immersed in boiling water at 100° C. for 2, 4 and 6 hours and then in a soldering bath at 288° C. for 20 seconds to observe any abnormal appearance such as blistering and others. The results observed were rated as ○ for formation of no blister, Δ for formation of small blisters and X for formation of large blisters, respectively.
High Temperature Flexural Modulus A copper foil of the cooper clad laminated sheet with thickness of 0.8 mm was similarly removed to the above method and cut into a specimen 100 mm long and 25 mm wide to measure the high temperature flexural modulus under atmosphere at 250° C. according to JIS C6481.
UV Shielding Efficiency A copper foil of the cooper clad laminated sheet with thickness of 0.1 mm was similarly removed to the above method to form a test specimen. Intensity of UV light generated from a super high pressure mercury lamp was at first measured with a UV sensor (wavelength measured at 420 nm) to set as a (default value). The test specimen obtained in the above was sandwiched therebetween and intensity of UV light was similarly measured to assign as a (test sample value). A UV shielding efficiency was determined by following formula.

UV shielding efficiency (%)=(Default value)/(Test sample value)×100

Heat Resistance

A copper clad laminated sheet with thickness of 0.2 mm was cut into a 50 mm square, which was used to measure heat resistance according to JIS C6481.

Results of the above properties measured are summarized in Tables 1 to 5.

TABLE 1

|  |  | Example 1 | Example 2 | Example 3 |
|---|---|---|---|---|
| Epoxy resin (parts by mass) |  | Preliminarily reacted resin 4 (45) | Preliminarily reacted resin 1 (86.7) | Preliminarily reacted resin 2 (76.9) |
|  |  | Epoxy 7 (55) | Epoxy 5 (48) | Epoxy 5 (50) |
| Phosphorous compound (parts by mass) |  | Contained in the above | Contained in the above | Contained in the above |
| Inorganic filler (parts by mass) | Inorganic filler with thermal decomposition temperature above 400° C. | Filler 6 (70) | Filler 7 (60) | Filler 9 (70) |
|  | Inorganic filler other than above filler | Filler 10 (50) | Filler 1 (50) | Filler 2 (50) |
| Curing agent (parts by mass) |  | Curing agent 1 (42) | Curing agent 1 (40) | Curing agent 2 (38.8) |
| Curing promoter (parts by mass) |  | Curing promoter 1 (0.1) | Curing promoter 1 (0.1) | Curing promoter 1 (0.1) |
| Solvent (parts by mass) |  | Solvent 2 (46) Solvent 3 (50) | Solvent 1 (34) Solvent 2 (34) Solvent 3 (40) | Solvent 1 (84) |
| Blackening agent |  | — | — | — |
| Content of preliminarily reacted epoxy resin (% by mass) (against total mass of epoxy resin) |  | 45% | 52% | 50% |
| Epoxy equivalent of bifunctional epoxy resin against an equivalent of phenolic hydroxyl group of phosphorous compound in preliminarily reacted epoxy resin |  | 2.4 | 2.0 | 1.8 |

TABLE 1-continued

|  | Example 1 | Example 2 | Example 3 |
|---|---|---|---|
| Epoxy equivalent of multifunctional epoxy resin against an equivalent of phenolic hydroxyl group of phosphorous compound in preliminarily reacted epoxy resin | — | — | 0.3 |
| Phosphorous content in resin solid component (% by mass) | 1.30% | 1.50% | 1.04% |
| Inorganic filler with thermal decomposition temperature above 400° C. (parts by mass) | 70 | 60 | 70 |
| Total amount of inorganic filler (parts by mass) | 120 | 110 | 120 |
| High temperature flexural modulus (250° C.) | 1000 kgf/mm$^2$ | 1000 kgf/mm$^2$ | 1000 kgf/mm$^2$ |
| Solder heat resistance in boiling water (immersion in solder bath for 20 seconds) | | | |
| Boiling for 2 hours | ○○○○○ | ○○○○○ | ○○○○○ |
| Boiling for 4 hours | ○○○○○ | ○○○○○ | ○○○○○ |
| Boiling for 6 hours | ○○○△△ | ○○○○○ | ○○○○○ |
| Ignition resistance (UL94) 0.2 t | V-0 | V-0 | V-0 |
| Average time in second for flame quenching | 1.5 second | 1.4 second | 1.6 second |
| UV shielding efficiency | 70% | 70% | 95% |
| Tg (DMA) | 200° C. | 210° C. | 210° C. |
| Heat resistance | 260° C. | 260° C. | 280° C. |

TABLE 2

|  |  | Example 4 | Example 5 | Example 6 |
|---|---|---|---|---|
| Epoxy resin (parts by mass) | | Preliminarily reacted resin 5 (45) | Preliminarily reacted resin 3 (35) | Preliminarily reacted resin 6 (30) |
|  |  | Epoxy 6 (55) | Epoxy 5 (65) | Epoxy 6 (70) |
| Phosphorous compound (parts by mass) | | Contained in the above | Contained in the above | Contained in the above |
| Inorganic filler (parts by mass) | Inorganic filler with thermal decomposition temperature above 400° C. | Filler 8 (150) | Filler 9 (90) | Filler 7 (60) |
|  | Inorganic filler other than above filler | Filler 1 (30) | Filler 3 (55) | Filler 4 (50) |
| Curing agent (parts by mass) | | Curing agent 1 (3.8) | Curing agent 3 (45.2) | Curing agent 1 (4.0) |
| Curing promoter (parts by mass) | | Curing promoter 1 (0.1) | Curing promoter 1 (0.1) | Curing promoter 1 (0.1) |
| Solvent (parts by mass) | | Solvent 1 (40.8) Solvent 2 (40.8) Solvent 3 (40) | Solvent 1 (80.7) Solvent 2 (80.7) | Solvent 1 (25) Solvent 2 (50) Solvent 3 (40) |
| Blackening agent | | — | Blackening agent 1 (10) | — |
| Content of preliminarily reacted epoxy resin (% by mass) (against total mass of epoxy resin) | | 45% | 35% | 30% |
| Epoxy equivalent of bifunctional epoxy resin against an equivalent of phenolic hydroxyl group of phosphorous compound in preliminarily reacted epoxy resin | | 1.9 | 1.9 | 2.4 |
| Epoxy equivalent of multifunctional epoxy resin against an equivalent of phenolic hydroxyl group of phosphorous compound in preliminarily reacted epoxy resin | | — | — | — |
| Phosphorous content in resin solid component (% by mass) | | 1.04% | 0.71% | 0.71% |
| Inorganic filler with thermal decomposition temperature above 400° C. (parts by mass) | | 150 | 90 | 60 |
| Total amount of inorganic filler (parts by mass) | | 180 | 145 | 110 |

TABLE 2-continued

|  | Example 4 | Example 5 | Example 6 |
| --- | --- | --- | --- |
| High temperature flexural modulus (250° C.) | 1200 kgf/mm$^2$ | 1100 kgf/mm$^2$ | 1000 kgf/mm$^2$ |
| Solder heat resistance in boiling water (immersion in solder bath for 20 seconds) | | | |
| Boiling for 2 hours | ○○○○○ | ○○○○○ | ○○○○○ |
| Boiling for 4 hours | ○○○○○ | ○○○○○ | ○○○○○ |
| Boiling for 6 hours | ○○○○○ | ○○○▲▲ | ○○○○○ |
| Ignition resistance (UL94) 0.2 t | V-0 | V-0 | V-0 |
| Average time in second for flame quenching | 1.6 second | 2.1 second | 2.3 second |
| UV shielding efficiency | 70% | 99% | 70% |
| Tg (DMA) | 200° C. | 200° C. | 220° C. |
| Heat resistance | 260° C. | 270° C. | 260° C. |

TABLE 3

|  |  | Example 7 | Example 8 | Example 9 |
| --- | --- | --- | --- | --- |
| Epoxy resin (parts by mass) | | Preliminarily reacted resin 7 (76.9) Epoxy 5 (50) | Preliminarily reacted resin 8 (79.6) Epoxy 5 (50) | Preliminarily reacted resin 2 (46.2) Epoxy 5 (70) |
| Phosphorous compound (parts by mass) | | Contained in the above | Contained in the above | Contained in the above |
| Inorganic filler (parts by mass) | Inorganic filler with thermal decomposition temperature above 400° C. | Filler 6 (40) | Filler 9 (80) | Filler 7 (90) |
| | Inorganic filler other than above filler | Filler 4 (70) | Filler 3 (40) | Filler 2 (40) |
| Curing agent (parts by mass) | | Curing agent 2 (38.7) | Curing agent 1 (4.0) | Curing agent 2 (46.6) |
| Curing promoter (parts by mass) | | Curing promoter 1 (0.1) | Curing promoter 1 (0.1) | Curing promoter 1 (0.1) |
| Solvent (parts by mass) | | Solvent 1 (69.5) Solvent 2 (69.5) | Solvent 2 (26.4) Solvent 3 (40) | Solvent 1 (66.4) Solvent 2 (66.4) |
| Blackening agent | | — | — | — |
| Content of preliminarily reacted epoxy resin (% by mass) (against total mass of epoxy resin) | | 50% | 52% | 30% |
| Epoxy equivalent of bifunctional epoxy resin against an equivalent of phenolic hydroxyl group of phosphorous compound in preliminarily reacted epoxy resin | | 2 | 1.6 | 1.8 |
| Epoxy equivalent of multifunctional epoxy resin against an equivalent of phenolic hydroxyl group of phosphorous compound in preliminarily reacted epoxy resin | | — | 0.2 | 0.3 |
| Phosphorous content in resin solid component (% by mass) | | 1.04% | 1.59% | 0.59% |
| Inorganic filler with thermal decomposition temperature above 400° C. (parts by mass) | | 40 | 80 | 90 |
| Total amount of inorganic filler (parts by mass) | | 110 | 120 | 130 |
| High temperature flexural modulus (250° C.) | | 1000 kgf/mm$^2$ | 1000 kgf/mm$^2$ | 1150 kgf/mm$^2$ |
| Solder heat resistance in boiling water (immersion in solder bath for 20 seconds) | | | | |
| Boiling for 2 hours | | ○○○○○ | ○○○○○ | ○○○○○ |
| Boiling for 4 hours | | ○○○○○ | ○○○○○ | ○○○○○ |
| Boiling for 6 hours | | ○○○▲▲ | ○○○○○ | ○○○▲▲ |
| Ignition resistance (UL94) 0.2 t | | V-0 | V-0 | V-0 |
| Average time in second for flame quenching | | 1.5 second | 1.7 second | 2.2 second |

TABLE 3-continued

|  | Example 7 | Example 8 | Example 9 |
|---|---|---|---|
| UV shielding efficiency | 95% | 70% | 95% |
| Tg (DMA) | 200° C. | 210° C. | 220° C. |
| Heat resistance | 280° C. | 260° C. | 280° C. |

TABLE 4

| | | Example 10 | Example 11 | Example 12 |
|---|---|---|---|---|
| Epoxy resin (parts by mass) | | Preliminarily reacted resin 1 (50) Epoxy 8 (50) | Preliminarily reacted resin 7 (50) Epoxy 5 (50) | Preliminarily reacted resin 2 (46.2) Epoxy 5 (70) |
| Phosphorous compound (parts by mass) | | Contained in the above | Contained in the above | Contained in the above |
| Inorganic filler (parts by mass) | Inorganic filler with thermal decomposition temperature above 400° C. | Filler 5 (70) | Filler 6 (100) | Filler 7 (120) |
| | Inorganic filler other than above filler | Filler 4 (70) | Filler 3 (40) | — |
| Curing agent (parts by mass) | | Curing agent 1 (3.9) | Curing agent 4 (40.4) | Curing agent 2 (46.6) |
| Curing promoter (parts by mass) | | Curing promoter 1 (0.1) | Curing promoter 1 (0.1) | Curing promoter 1 (0.1) |
| Solvent (parts by mass) | | Solvent 1 (45.7) Solvent 2 (45.7) Solvent 3 (40) | Solvent 1 (93.5) Solvent 2 (93.5) | Solvent 1 (66.4) Solvent 2 (66.4) |
| Blackening agent | | — | — | — |
| Content of preliminarily reacted epoxy resin (% by mass) (against total mass of epoxy resin) | | 50% | 50% | 30% |
| Epoxy equivalent of bifunctional epoxy resin against an equivalent of phenolic hydroxyl group of phosphorous compound in preliminarily reacted epoxy resin | | 2 | 2.0 | 1.8 |
| Epoxy equivalent of multifunctional epoxy resin against an equivalent of phenolic hydroxyl group of phosphorous compound in preliminarily reacted epoxy resin | | — | — | 0.3 |
| Phosphorous content in resin solid content (% by mass) | | 1.40% | 1.03% | 0.59% |
| Inorganic filler with thermal decomposition temperature above 400° C. (parts by mass) | | 70 | 100 | 120 |
| Total amount of inorganic filler (parts by mass) | | 140 | 140 | 120 |
| High temperature flexural modulus (250° C.) | | 950 kgf/mm$^2$ | 950 kgf/mm$^2$ | 1100 kgf/mm$^2$ |
| Solder heat resistance in boiling water (immersion in solder bath at 288° C. for 20 seconds) | | | | |
| Boiling for 2 hours | | ○○○○○ | ○○○○○ | ○○○○○ |
| Boiling for 4 hours | | ○○○○○ | ○○○○○ | ○○○○○ |
| Boiling for 6 hours | | ○○○▲▲ | ○○▲▲▲ | ○○○○○ |
| Ignition resistance (UL94) 0.2 t | | V-0 | V-0 | V-0 |
| Average time in second for flame quenching | | 1.3 second | 1.6 second | 3.0 seconds |
| UV shielding efficiency | | 70% | 70% | 95% |
| Tg (DMA) | | 180° C. | 190° C. | 220° C. |
| Heat resistance | | 260° C. | 270° C. | 280° C. |

TABLE 5

|  | Comparative example 1 | Comparative example 2 | Comparative example 3 | Comparative example 4 |
|---|---|---|---|---|
| Epoxy resin (parts by mass) | Preliminarily reacted resin 7 (70) Epoxy 5 (30) | Preliminarily reacted resin 2 (101.5) Epoxy 5 (34) | Preliminarily reacted resin 1 (66.7) Epoxy 5 (60) | Preliminarily reacted resin 2 (101.5) Epoxy 5 (34) |

TABLE 5-continued

| | Comparative example 1 | Comparative example 2 | Comparative example 3 | Comparative example 4 |
|---|---|---|---|---|
| Phosphorous compound (parts by mass) | Contained in the above | Contained in the above | Contained in the above | Contained in the above |
| Inorganic filler (parts by mass) — Inorganic filler with thermal decomposition temperature above 400° C. | — | — | — | — |
| Inorganic filler other than above filler | Filler 2 (45) | Filler 2 (28.3) | Filler 2 (120) | Filler 2 (170) |
| Curing agent (parts by mass) | Curing agent 1 (3.5) | Curing agent 1 (3.6) | Curing agent 1 (3.5) | Curing agent 1 (3.6) |
| Curing promoter (parts by mass) | Curing promoter 1 (0.1) | Curing promoter 1 (0.1) | Curing promoter 1 (0.1) | Curing promoter 1 (0.1) |
| Solvent (parts by mass) | Solvent 1 (25) Solvent 2 (40) Solvent 3 (35) | Solvent 3 (35) | Solvent 2 (34) Solvent 3 (35) | Solvent 3 (35) |
| Blackening agent | — | — | — | — |
| Content of preliminarily reacted epoxy resin (% by mass) (against total mass of epoxy resin) | 46% | 66% | 40% | 66% |
| Epoxy equivalent of bifunctional epoxy resin against an equivalent of phenolic hydroxyl group of phosphorous compound in preliminarily reacted epoxy resin | 2 | 1.8 | 2 | 1.8 |
| Epoxy equivalent of multifunctional epoxy resin against an equivalent of phenolic hydroxyl group of phosphorous compound in preliminarily reacted epoxy resin | — | 0.3 | — | 0.3 |
| Phosphorous content in resin solid component (% by mass) | 2.00% | 1.85% | 1.12% | 1.85% |
| Inorganic filler with thermal decomposition temperature above 400° C. (parts by mass) | 0 | 0 | 0 | 0 |
| Total amount of inorganic filler (parts by mass) | 45 | 28.3 | 120 | 170 |
| High temperature flexural modulus (250° C.) | 600 kgf/mm$^2$ | 650 kgf/mm$^2$ | 900 kgf/mm$^2$ | Unable to mold because of formation of voids |
| Solder heat resistance in boiling water (immersion in solder bath at 288° C. for 20 seconds) | | | | |
| Boiling for 2 hours | ○○○○○ | ○○○○○ | ○○○○○ | |
| Boiling for 4 hours | ○○○○○ | ○○○○○ | ▲▲XXX | |
| Boiling for 6 hours | ○○○▲▲ | ○○▲▲▲ | XXXXX | |
| Ignition resistance (UL94) 0.2 t | V-0 | V-0 | V-0 | |
| Average time in second for flame quenching | 1.2 second | 1.2 second | 1.6 seconds | |
| UV shielding efficiency | 70% | 70% | 70% | |
| Tg (DMA) | 200° C. | 220° C. | 200° C. | |
| Heat resistance | 260° C. | 260° C. | 260° C. | |

Comparative examples 1 and 2 are the example comprising more than 60% by mass of the preliminarily reacted epoxy resin and a low content of the filler, indicating lower high temperature rigidity (high temperature elastic modulus) as compared with Examples.

Comparative example 3 is also a system comprising less than 60% by mass of the preliminarily reacted epoxy resin in the total epoxy resin and simply increasing an amount of the inorganic filler, indicating decrease of solder heat resistance while increasing high temperature rigidity (high temperature flexural modulus). On the other hand, as shown in Examples, systems comprising 20 parts by mass or more but less than 180 parts by mass of the inorganic filler with thermal decomposition temperature (weight loss by 5%) at 400° C. or higher against 100 parts by mass of the resin solid content indicate satisfaction of both high temperature rigidity and solder heat resistance.

Comparative example 4 is also a system increasing an amount of the inorganic filler in Comparative example 2, where viscosity of whole epoxy resin is increased because more than 60% by mass of the preliminarily reacted epoxy resin is contained in the total epoxy resin. When the inorganic filler is added in an enough volume to obtain rigidity of the base substrate (100 parts by mass or more against 100 parts by mass of resin solid content), it is shown that voids are generated so that a copper clad laminated sheet cannot be prepared.

Examples 3, 7, 9 and 12 are also the system using as a curing agent a multifunctional phenolic curing agent represented by formula 8, indicating improvement of UV shielding as compared with other Examples. Furthermore, they also indicate glass transition temperature (Tg) is improved as compared with Example 11, where a phenol novolac type multifunctional phenol is used as a curing agent.

Example 5 also is the system using as a curing agent a multifunctional phenolic curing agent represented by formula 9, indicating improvement of a glass transition temperature (Tg) as compared with Example 11, where phenol novolac type multifunctional phenol is used as a curing agent. Furthermore, Example 5 is the system using a blackening agent, indicating improvement of UV shielding as compared with other Examples.

Examples of 1, 2, 4, 6 and 8 also are the system using a multifunctional epoxy resin of which benzene rings are linked with a bond other than methylene bond, indicating improvement of a glass transition temperature (Tg) as compared with Example 10, where the phenol novolac type multifunctional epoxy resin is used.

Example 12 also is the system not using aluminum hydroxide or magnesium hydroxide as an inorganic filler, indicating lower ignition resistance as compared with Example 9, where aluminum hydroxide is used.

The invention claimed is:

1. An epoxy resin composition for a prepreg used in manufacturing a printed wiring board, said composition comprising:
   (A) a multifunctional epoxy resin having on average 2.8 or more epoxy groups per molecule;
   (B) a reaction product of a phosphorous compound, a bifunctional epoxy resin, and an optional multifunctional epoxy resin, wherein the phosphorous compound has on average 1.8 to 3 phenolic hydroxyl groups per molecule and on average 0.8 or more phosphorous atoms per molecule, the bifunctional epoxy resin has on average 1.8 to 2.6 epoxy groups per molecule, and the optional multifunctional epoxy resin has on average 2.8 or more epoxy groups per molecule;
   (C) a curing agent selected from dicyandiamide, a multifunctional phenolic compound or a combination thereof; and
   (D) an inorganic filler blend comprising a first inorganic filler having a thermal decomposition temperature (weight loss by 5%) at 400° C. or above and at least one additional inorganic filler different from said first inorganic filler;
wherein the reaction product (B) is formulated and reacted with a ratio of epoxy equivalent of the bifunctional epoxy to hydroxy equivalent of the phosphorous compound ranging from 1.2 to less than 3, and a ratio of epoxy equivalent of the optional multifunctional epoxy resin to hydroxy equivalent of the phosphorous compound ranging from 0.05 to less than 0.8;
wherein the reaction product (B) is provided in an amount of 20% to 55% by mass based on the total amount of epoxy resin, including (A) and (B), present in the epoxy resin composition;
wherein the bifunctional epoxy resin is selected from epoxy resins represented by formula (1), formula (2), formula (3) or formula (4);

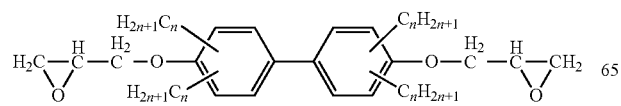

(1)

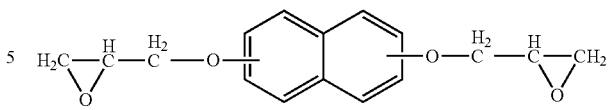

(2)

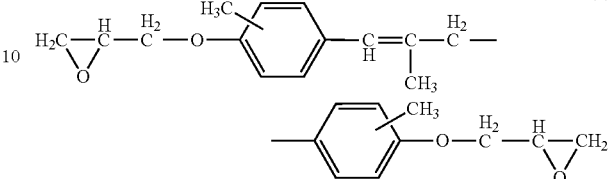

(3)

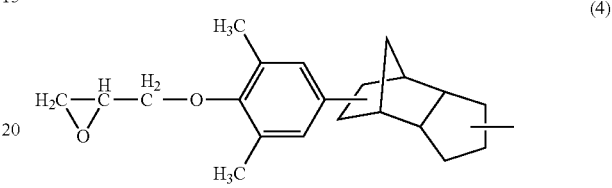

(4)

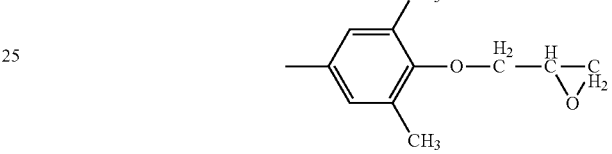

n = 0, 1, 2, 3, 4 wherein the inorganic filler blend (D) is provided in an amount of 110 to less than 200 parts by mass per 100 parts by mass of resin solids; and wherein the first inorganic filler is provided in an amount of 20 to less than 180 parts by mass per 100 parts by mass of resin solids.

2. The epoxy resin composition of claim 1, wherein (B) is a reaction product of said phosphorous compound, said bifunctional epoxy resin, and said multifunctional epoxy resin.

3. The epoxy resin composition of claim 1, wherein the at least one additional inorganic filler of (D) is aluminum hydroxide, magnesium hydroxide or a combination of both aluminum hydroxide and magnesium hydroxide.

4. The epoxy resin composition of claim 1, wherein the first inorganic filler of (D) is spherical silica with an average particle diameter of from 0.05 μm to 5 μm.

5. The epoxy resin composition of claim 1, wherein the inorganic filler blend (D) is surface-treated with a coupling agent.

6. The epoxy resin composition of claim 1, wherein the phosphorous compound is represented by formula (5), formula (6) or formula (7):

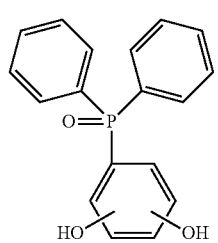

(5)

-continued

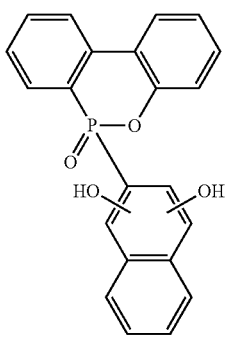
(6)

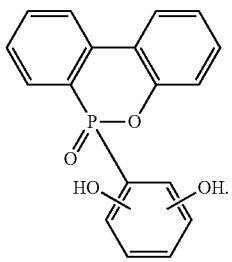
(7)

7. The epoxy resin composition of claim 1, wherein the total amount of epoxy resin, including (A) and (B) has a phosphorous atom content of 0.5% to less than 3.5% by mass.

8. The epoxy resin composition of claim 1, wherein the multifunctional epoxy resin of (A), (B) or both (A) and (B) has a skeletal structure comprising benzene rings linked by a bond other than a methylene bond.

9. The epoxy resin composition of claim 1, wherein the multifunctional phenolic compound of (C) is represented by formula (8):

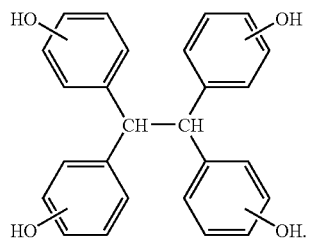
(8)

10. The epoxy resin composition of claim 1, wherein the multifunctional phenolic compound of (C) is represented by formula (9):

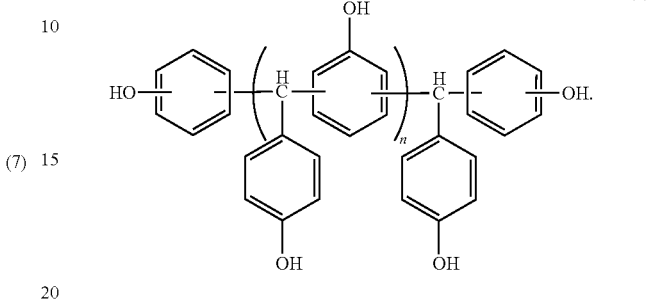
(9)

11. A prepeg comprising a base substrate impregnated with the epoxy resin composition of claim 1, wherein the impregnated substrate is dried to semi-cure.

12. A multilayered printed wiring board comprising a base substrate, a prepreg of claim 11, laminated and molded on one side of said substrate, and a second prepreg of claim 11 laminated and molded on the other side of said substrate, wherein said base substrate has a circuit pattern formed thereon.

13. The prepreg of claim 11, wherein the epoxy resin composition further comprises a black pigment, a black dye or a combination thereof.

14. A multilayered printed wiring board comprising a base substrate, a prepreg of claim 13 laminated and molded on one side of said base substrate, and a second prepreg of claim 13 laminated and molded on the other side of said substrate, wherein said base substrate has a circuit pattern formed thereon.

* * * * *